(12) United States Patent
Sakamoto et al.

(10) Patent No.: US 6,756,610 B2
(45) Date of Patent: Jun. 29, 2004

(54) LIGHT IRRADIATING DEVICE

(75) Inventors: Noriaki Sakamoto, Gunma (JP); Yoshiyuki Kobayashi, Gunma (JP); Eiju Maehara, Gunma (JP); Kouji Takahashi, Gunma (JP); Junji Sakamoto, Gunma (JP); Shigeaki Mashimo, Gunma (JP); Katsumi Okawa, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 17 days.

(21) Appl. No.: 10/386,731

(22) Filed: Mar. 12, 2003

(65) Prior Publication Data

US 2003/0170922 A1 Sep. 11, 2003

Related U.S. Application Data

(62) Division of application No. 09/871,316, filed on May 31, 2001, now Pat. No. 6,558,970.

(30) Foreign Application Priority Data

Jun. 9, 2000 (JP) .................................... P. 2000-173581

(51) Int. Cl.[7] .............................................. H01L 27/15
(52) U.S. Cl. .............................. 257/79; 257/82; 257/99; 257/100; 257/103; 257/13; 438/22; 438/25; 438/26; 438/27; 438/29

(58) Field of Search ............................... 257/59, 72, 13, 257/79–103, 918; 438/22, 24–29, 37, 46, 47, 936, 956, 110–113

(56) References Cited

U.S. PATENT DOCUMENTS

| 5,976,912 A | 11/1999 | Fukutomi et al. |
| 6,001,671 A | 12/1999 | Fjelstad |
| 6,025,650 A | 2/2000 | Tsuji et al. |
| 6,031,292 A | 2/2000 | Murakami et al. |
| 6,239,384 B1 | 5/2001 | Smith et al. |
| 6,451,627 B1 * | 9/2002 | Coffman ..................... 438/111 |
| 2001/0052600 A1 | 12/2001 | Sakamoto et al. |

FOREIGN PATENT DOCUMENTS

| JP | 2000-58924 | 2/2000 |
| JP | 2000-77725 | 3/2000 |

* cited by examiner

*Primary Examiner*—David Nelms
*Assistant Examiner*—Andy Huynh
(74) *Attorney, Agent, or Firm*—Fish & Richardson P.C.

(57) ABSTRACT

A light irradiating device (68) having the good radiation characteristic comprises a plurality of conductive paths (51) that are electrically separated, a photo semiconductor chips (65) fixed onto desired conductive path (51), and a resin (67) for covering the photo semiconductor chips (65) to support the conductive paths (51) integrally.

13 Claims, 10 Drawing Sheets

LIGHT IRRADIATING DEVICE

This is a divisional application of U.S. application Ser. No. 09/871,316 filed May 31, 2001 now U.S. Pat. No. 6,558,970, which in turn claims benefit of Japanese application No. 2000-173581 filed Jun. 9, 2000.

BACKGROUND OF THE INVENTION

The present invention relates to a light irradiating device, manufacturing method thereof and lighting apparatus using the light irradiating device, more particularly, the technology of achieving the improvement in the light irradiation efficiency and the improvement in the reliability of the device.

First, in case the light must be irradiated in great quantities, normally the electric lamp, etc. are employed. However, for the purpose of the reduction in weight, thickness, and size and the saving of electricity, sometimes the light emitting elements 2 are mounted on the printed circuit board 1, as showing FIG. 19.

The light emitting diode formed of the semiconductor is mainly employed as this light emitting element. But the semiconductor laser, etc. may also be employed.

Figure 19:
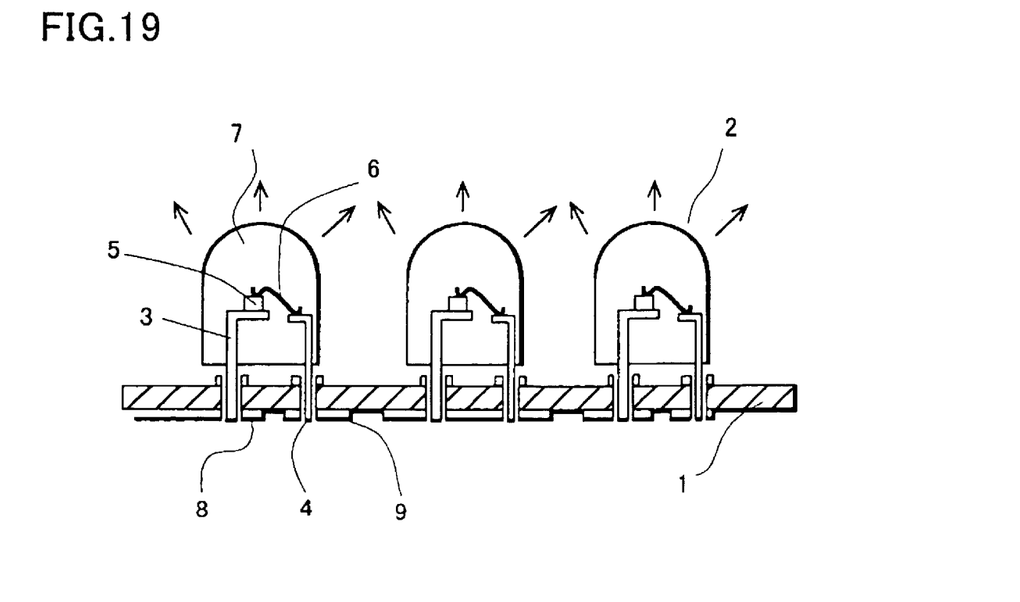
FIG. 19 is a view showing a light irradiating device in the conventional art.

The light emitting diode 2 has two leads 3, 4. One lead 3 is adhered to the back surface of the light emitting diode chip 5 (the anode electrode or the cathode electrode) with the solder, etc., while the other lead 4 is electrically connected to the electrode on the chip surface (the cathode electrode or the anode electrode) via the metal thin wire 6. Also, the transparent resin sealing member 7 for sealing the leads 3, 4, the chip 5, and the metal thin wire 6 is formed to be used as a lens.

Meanwhile, the electrodes 8, 9 for supplying the power supply to the light emitting diode 2 are provided to the printed circuit board 1. The above leads 3, 4 are inserted into the through holes provided in the printed circuit board 1, and the light emitting diode 2 is fixed/mounted onto the printed circuit board 1 via the solder, etc.

For example, the light irradiating device employing the light emitting diodes is explained in Japanese Patent Application Publication No. H09-252651.

However, since the above light emitting diode 2 is formed as the package into which the resin sealing member 7, the leads 3, 4, etc. are incorporated, there is the drawback such that the size of the packaged substrate 1 is increased. Also, since the radiating characteristic of the substrate itself is inferior, there is the problem such that the temperature rise is brought about as a whole. Therefore, there are the problems such that the temperature rise of the semiconductor chip itself is caused and thus the driving capability is lowered.

In addition, the light emitting diode chip 5 also emits the light from its side surface of the chip. Thus, there exists the light that is directed toward the substrate 1. However, since the substrate 1 is formed of the printed circuit board, there is the problem such that the highly effective emission in which all the lights are emitted upward cannot be achieved.

SUMMARY OF THE INVENTION

The present invention has been made in light of the above subjects, and provides a light irradiating device having the good radiation characteristic, that comprises a plurality of conductive paths that are electrically separated, photo semiconductor chips that are fixed onto desired conductive paths, and a resin for covering the photo semiconductor chips and serving as a lens to support the conductive paths integrally.

Also, there is provided a light irradiating device that comprises a plurality of conductive paths that are electrically separated by isolation trenches, photo semiconductor chips that are fixed onto desired conductive paths, and a resin for covering the photo semiconductor chips to fill the isolation trenches between the conductive paths and serving as a lens to support the conductive paths integrally while exposing only back surfaces of the conductive paths. Therefore, back surfaces of the conductive paths can be connected to the outside to eliminate through holes and thus the above subjects can be overcome.

In addition, there is provided a light irradiating device manufacturing method that comprises the steps of preparing a conductive foil and then forming conductive paths by forming isolation trenches, which are shallower than a thickness of the conductive foil, in the conductive foil except at least areas serving as the conductive paths, adhering respective photo semiconductor chips onto desired conductive paths, molding a resin serving as a lens to cover respective photo semiconductor chips and to fill the isolation trenches, and removing the conductive foil on a side on which the isolation trenches are not provided. Therefore, since the conductive foil to form the conductive paths is employed as the starting material, the conductive foil has the supporting function until the resin is molded, and the resin has the supporting function after the molding, the supporting substrate can be omitted and thus the above subjects can be overcome.

Further, there is provided a light irradiating device manufacturing method that comprises the steps of preparing a conductive foil and then forming a plurality of conductive paths by forming isolation trenches, which are shallower than a thickness of the conductive foil, in the conductive foil except at least areas serving as the conductive paths, adhering a plurality of photo semiconductor chips onto desired conductive paths, forming connecting means for electrically connecting electrodes of the photo semiconductor chips and desired conductive paths, molding a resin to cover the plurality of photo semiconductor chips and to fill the isolation trenches, removing the conductive foil having a thickness portion, on which the isolation trenches are not provided, and separating the photo semiconductor chips into an individual photo semiconductor chip by cutting the resin. Therefore, a large number of light irradiating devices can be mass-produced and thus the above subjects can be overcome.

Also, if the corrosion-resistant conductive film is formed in at least the areas, which serve as the conductive paths, of the surface of the conductive foil, this conductive film is left on the upper surface of the conductive foil like the visor when the isolation trenches are formed in the conductive foil. Therefore, the adhesiveness between the conductive foil and the resin can be improved when each light irradiating device is covered with the resin.

In addition, when the conductive foil is bent to surround at least the areas, to which the photo semiconductor chips are fixed respectively, of the conductive foil, such conductive foil is bent to have an inclination angle that enables the light emitted from the photo semiconductor chip to reflect upwardly. Therefore, the irradiation efficiency can be improved.

Further, the conductive foil is bent in the situation that the corrosion-resistant conductive film is formed on the conductive paths. Therefore, the gloss appears on the conductive film, and thus the irradiation efficiency can be much more improved.

Also, there are provided the step of removing the conductive foil on the side, in which the isolation trenches are not provided, up to a predetermined position after the light irradiating devices are covered with the resin to fill the isolation trenches, and then the step of separating the light irradiating devices that are covered with the resin. Therefore, respective light irradiating devices are not separated up to the final stage, and accordingly the conductive foil can be provided to respective steps as one sheet, and thus the workability becomes good.

Further, the resin is fixed by the transfer molding using the mold. Therefore, the workability can be improved and also the proper shape can be formed. Particularly, it is suitable for forming a lens shape.

Also, in the case that the individual light irradiating devices that are sealed with the resin are separated by the press machine, the process of removing the flash generated on the end portions of the light irradiating devices is not needed and thus the productivity can be improved.

Further, if the adhesiveness between the material of the conductive film and that of the insulating resin is lower than the adhesiveness between the material of the conductive foil and that of the insulating resin, the conductive film is formed on the conductive foil in the area smaller than the area served as at least the conductive path. Therefore, the area on the conductive foil where the conductive film does not covered, becomes large. Therefore, the adhesiveness between the conductive foil and the resin can be improved when light irradiating device is covered with the resin.

DETAILED DESCRIPTION OF THE PREFERRED EMBODIMENT (Embodiment 1)

Embodiments of a light irradiating device and a method of manufacturing the same according to the first embodiment of the present invention will be explained with reference to the accompanying drawings hereinafter.

Figure 1:
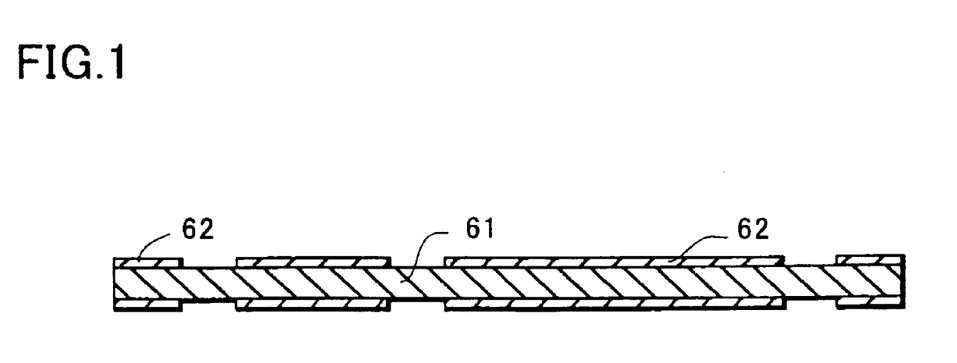
FIG. 1 is a sectional view showing a light irradiating device manufacturing method of the first embodiment.

In FIG. 1, 61 is a sheet-like conductive foil. The material is selected with regard to the adhesive property, the bonding property, and the plating property of the brazing material. The conductive foil containing Cu (copper) as main material, the conductive foil containing Al (aluminum) as main material, the conductive foil formed of the alloy such as Fe—Ni (iron-nickel), Cu—Al (copper-aluminum), Al—Cu—Al (aluminum-copper-aluminum) etc., or the like may be employed.

It is preferable that a thickness of the conductive foil should be set to about 10 $\mu$m to 300 $\mu$m light of the later etching. Here the copper foil of 100 $\mu$m thickness is employed. But basically the thickness of more than 300 $\mu$m or less than 10 $\mu$m may be employed. As described later, any thickness may be selected if isolation trenches 64 that is shallower than the thickness of the conductive foil 61 can be formed in the conductive foil.

In this case, the sheet-like conductive foil 61 that is wound on a roller to have a predetermined width may be prepared and then be carried to respective steps described later, otherwise the conductive foil that is cut into a predetermined size may be prepared and then be carried to respective steps described later.

Then, the plating process is applied to predetermined areas of the front surface and the back surface of the conductive foil 61 respectively. In the present embodiment, a film formed of Ag (silver) (referred to as an "Ag film 62" hereinafter) is formed as the conductive film 62, but the conductive film is not limited to this. For example, there are Au (gold), Ni (nickel), Pd (palladium), Al (aluminum), or the like, as other materials. In addition, these corrosion-resistant conductive films have the feature that they can be practically employed as the die pad or the bonding pad as they are. Further, the Ag film 62 formed only on the front surface of the conductive foil 61 may be employed.

For example, the above Ag film 62 adheres to not only Au but also the brazing material. Therefore, if the Au film is coated on the back surface of the chip, the chip can be bonded to the Ag film 62 on a conductive path 51 by the thermo compression bonding as it is, and also the chip can be fixed via the brazing material such as the solder, etc. Further, since the Au thin wire can adhere to the Ag conductive film, it is also possible to apply the wire bonding.

Figure 2:
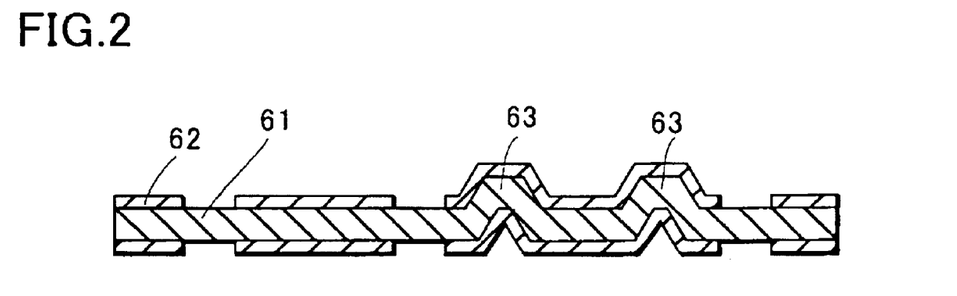
FIG. 2 is a sectional view showing a light irradiating device manufacturing method of the first embodiment.

Then, in FIG. 2, predetermined area of the conductive foil 61 are formed as an upwardly convex portion by applying the pressing process to the conductive foil 61, which is subjected to the plating process, thereby forming a convex portion 63. In this case, a photo semiconductor chip 65 described later is mounted in the photo semiconductor chip mounting portion of the sectional cup-shaped area formed by the convex portion 63. Then, the light emitted from the photo semiconductor chip 65 can be reflected by inclined portion formed by the convex portion 63 and the periphery of the inclined portion, and thus the irradiation efficiency can be improved. Further, if the pressing process is applied to the conductive foil 61 after the Ag film 62 is coated on the conductive foil 61, the gloss appears in the area pressed and bent (head portion of the convex portion 63) other than remaining areas. Thus, there can be achieved the advantage such that the reflection efficiency of the light emitted from the photo semiconductor chip, described later, can be improved.

It is of course that the conductive film may be formed after the press working. Further, the photo semiconductor chip may be formed on the conductive foil that is not subjected to the press working.

In this case, as described above, the gloss can be given to the Ag film 62 by not bending the conductive foil 61 but applying the pressure to the conductive foil 61 (and the Ag film 62) by the press, etc. in the situation that the Ag film 62 is formed, and thus the improvement of the irradiation efficiency can be achieved.

Figure 3:
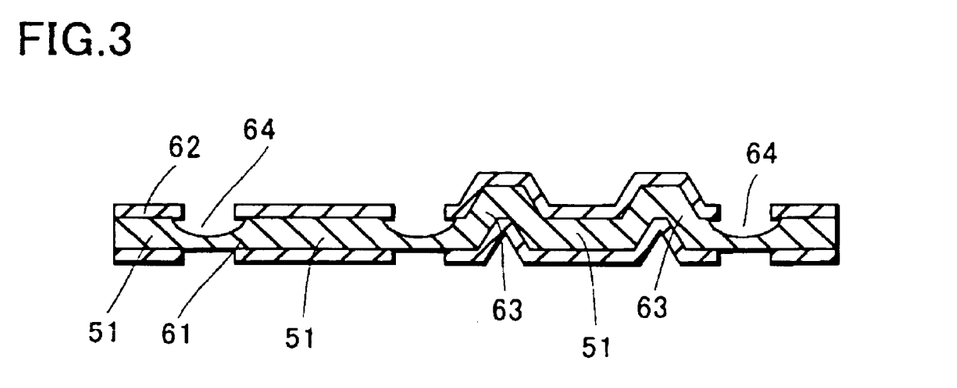
FIG. 3 is a sectional view showing a light irradiating device manufacturing method of the first embodiment.

In turn, in FIG. 3, if the half-etching process is applied to the surface of the conductive foil 61 while using the Ag film 62 as a mask in a state that the back surface of the conductive foil 61 is masked by a photoregist film (not shown), areas which are not subjected to the plating process are half-etched and then isolation trenches 64 are formed. In this case, a depth of the isolation trench 64 formed by this etching is 50 μm, for example, and the adhesiveness to a resin 67 which can transmit a light, described later, can be improved since side surfaces of the trench become a rough surface. A resist film may be formed on the Ag film 62 and then the half-etching process may be applied by using the resist film as a mask. In addition, the Ag film 62 may be formed after the half-etching is carried out.

Also, the side wall sectional shape of this isolation trench 64 has a different structure according to the removing method. As this removing method, the wet etching, the dry etching, the laser evaporation, the dicing, etc. maybe employed.

For example, in the case of the wet etching, the iron (II) chloride or the copper (II) chloride is employed mainly as the etchant. The conductive foil 61 is dipped into this etchant or is showered with this etchant. Since normally the conductive foil is anti-anisotropically etched by the wet etching, the side surface of the etched portion has a curved structure. At this time, since the conductive film 62 adhering to the conductive foil 61 is located over the isolation trench 64 like a visor, the adhesiveness can be improved when the photo semiconductor chip 65 is covered with the resin 67, described later. In the present embodiment, the wet etching process is applied.

Also, in the case of the dry etching, the anisotropic etching or the anti-anisotropic etching may be carried out. It is said at present that Cu cannot be removed by the reactive ion etching, but Cu can be removed by the sputtering. Also, the anisotropic etching or the anti-anisotropic etching can be carried out depending upon the conditions of the sputtering.

In addition, in the case of the laser evaporation, the isolation trench 64 can be formed by irradiating directly the laser beam. In this case, the side surface of the isolation trench 64 is rather formed as a flat surface.

Further, in the case of the dicing, it is impossible to form a complicated curved pattern, but it is possible to form the lattice isolation trench.

In the steps shown in FIG. 3, a photoresist film is coated selectively in place of the conductive film, and then the conductive foil 61 may be half-etched by using the photoresist film as a mask.

Figure 4:
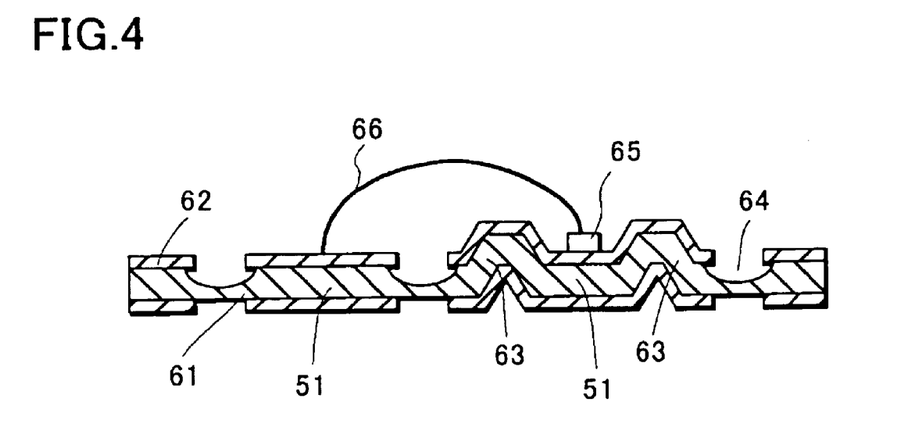
FIG. 4 is a sectional view showing a light irradiating device manufacturing method of the first embodiment.

Then, in FIG. 4, the photo semiconductor chip 65 is electrically connected to the conductive foil 61 in which the isolation trenches 64 are formed. Here the light emitting diode is employed as the photo semiconductor chip 65. The photo semiconductor chip 65 is bonded onto a first electrode 51A, described later, by the die bonding, and also the front surface of the photo semiconductor chip 65 and a second electrode 51B are bonded by the wire bonding via a metal thin wire 66 (see FIG. 6).

Figure 5:
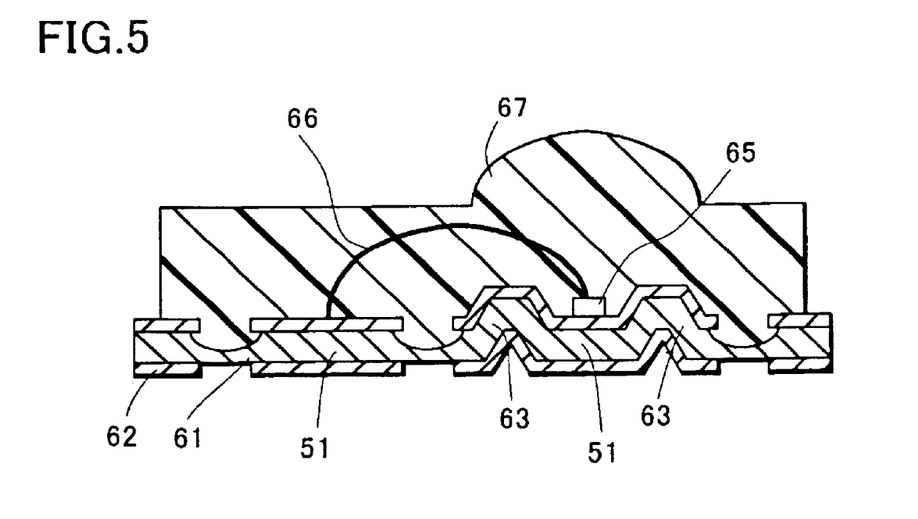
FIG. 5 is a sectional view showing a light irradiating device manufacturing method of the first embodiment.

Then, in FIG. 5, the conductive foil 61 containing the photo semiconductor chips 65 is covered with the insulating resin 67 that can transmit the light emitted from the photo semiconductor chip 65. In this step, the conductive foil 61 having the photo semiconductor chips 65 and the isolation trenches 64 is sealed with the thermosetting silicon resin or epoxy resin by virtue of the transfer molding using the mold (not shown). As described above, the resin 67 may be any resin which can transmit the light, and thus the so-called transparent resin or the opaque resin can transmit the light of a predetermined wavelength may be employed.

Figure 8:
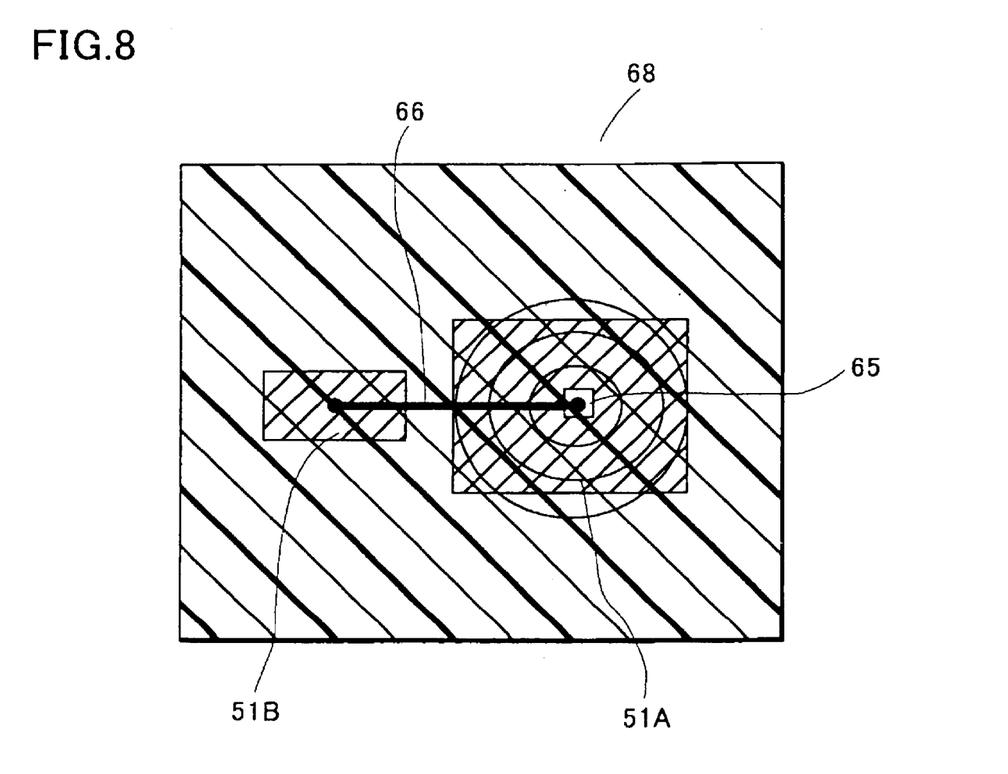
FIG. 8 is a plan view of a light irradiating device of the first embodiment.

Here, in order to collect the light from the photo semiconductor chips 65 as much as possible and emit it upward, the resin 67 has a convex lens shape. Accordingly, if viewed from the top, the lens has a substantially circular shape, as shown in FIG. 8. A thickness of the resin 67 (lens) coated on the surface of the conductive foil 61 can be set thick or thin with regard to the strength.

The feature of the present step is that the conductive foil 61 acts as the supporting substrate until the insulating resin 67 serving as the lens is coated. Then, since the good radiation characteristic is obtained rather than the structure in which the light emitting diodes 2 are mounted onto the printed circuit board 1 like the related art (see FIG. 19), the driving capability can be improved.

Further, since the conductive foil 61, used as the supporting substrate in the present invention, is the material that is necessary for the electrode material. Therefore, the present invention has the advantage such that the constituent material can be omitted to the utmost and can also achieve the reduction in cost.

Also, since the isolation trench 64 is formed shallower than the thickness of the conductive foil 61, the conductive foil 61 is not individually separated as the conductive paths 51. Accordingly, there is the advantage such that, when the sheet-like conductive foil 61 must be exchanged as a whole and then the resin 67 must be molded, the carrying operation to the mold and the fitting operation into the mold can be very simplified.

When the photo semiconductor chip 65 is sealed with the resin, the potting resin may be coated on the photo semiconductor chip 65 instead of the employment of the mold so as to form the lens shape.

However, in this case, since both the silicon-resin and the epoxy resin has small viscosity at the time of the heat curing, there is the problem such that the resin cannot be stably formed into the hemispherical shape that is preferable as the lens. In contrast, there is the advantage such that, if the above lens forming method using the mold is employed, the stable lens shape can be constructed. In case that the lens shape is not needed, the insulating resin 67 may be relatively thin, further, other than transfer molding using the mold may be used.

Figure 6:
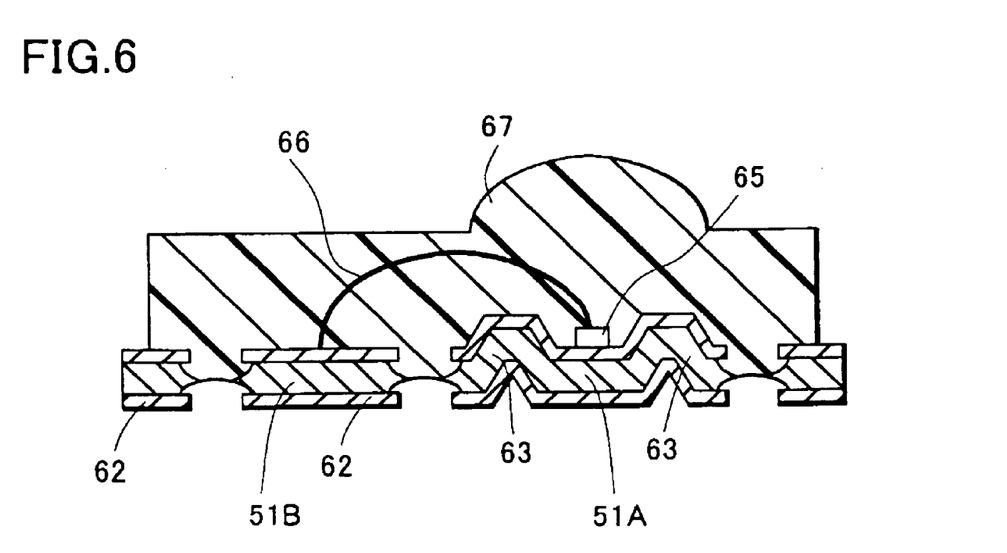
FIG. 6 is a sectional view showing a light irradiating device manufacturing method of the first embodiment.

In turn, in FIG. 6, there is the step that the conductive foil 61 is separated as the conductive paths 51 by removing the back surface of the conductive foil 61 chemically and/or physically. Here this removing step is carried out by the polishing, the grinding, the etching, the metal evaporation by the laser, etc.

In the present embodiment, the conductive foil 61 under the isolation trench 64 is deleted by wet-etching the conductive foil 61 while using the Ag film 62, that adheres onto the back surface of the conductive foil 61, as a mask. Thus, the resin 67 is exposed to separate the conductive paths respectively. Accordingly, there can be obtained such a structure that surfaces of conductive paths 51A, 51B (a first electrode and a second electrode) are exposed from the resin 67.

At this time, the resin 67 may be exposed from the isolation trench 64 by scraping the back surface of the conductive foil 61 by about 50–60 $\mu$m by virtue of the polishing machine, the grinding machine, or the like. In this case, the conductive foil 61 is separated as the conductive paths having a thickness of about 40 $\mu$m. Also, the resin 67 maybe exposed by wet-etching the entire surface of the conductive foil 61 to the extent not to expose the resin 67, and then scraping the overall surface by virtue of the polishing or grinding machine. In this case, the flat light irradiating device, in which the conductive paths 51 are buried in the resin 67 and the back surface of the resin 67 coincides in level with the back surface of the conductive paths 51, can be implemented.

Further, if the conductive paths 51 are separated by scraping the back surface of the conductive foil 61 by virtue of the polishing machine, the grinding machine, or the like, the oxidation inhibiting process of the conductive paths 51 may be applied by depositing the conductive material such as the solder, etc. onto the exposed conductive paths 51, as occasion demands.

Finally, there is the step of separating the neighboring light irradiating devices individually to complete the light irradiating device.

Figure 7:
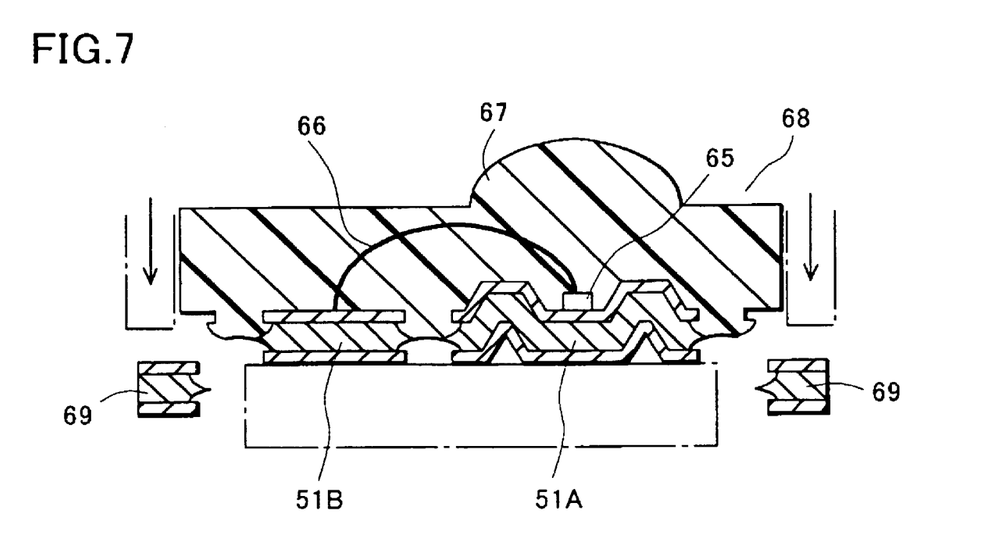
FIG. 7 is a sectional view showing a light irradiating device manufacturing method of the first embodiment.

This separating step can be carried out by the dicing, the cutting, the chocolate break, etc. If the chocolate break is employed, copper pieces 69 are stripped off from both end portions of the resin 67, that covers the light irradiating devices 68, by the press machine indicated by a dot-dash line in FIG. 7, whereby respective light irradiating devices 68 are separated. In this case, there can be achieved the advantage that, since the flash removing process of the back surface can be omitted unlike the dicing, the cutting, etc., the good workability can be achieved.

The feature of the present manufacturing method resides in that the separating operation of the conductive paths 51 can be attained while practically using the resin 67 as the supporting substrate. The resin 67 is the material necessary to fill the conductive paths 51, and the substrate used only for the supporting is not needed during the manufacturing steps. Accordingly, the present invention has the feature such that the light irradiating device can be manufactured by the minimum material and thus the reduction in cost can be accomplished.

The thickness of the resin from the surface of the conductive paths 51 can be adjusted when the resin is adhered in the preceding step. Therefore, the present invention has the feature such that the thickness of the light irradiating device 68 can be set thick or thin although such thickness is different according to the packaged photo semiconductor chip. The light irradiating device in which the conductive paths 51 of 40 $\mu$m thickness and the photo semiconductor chips are buried in the resin 67 of 400 $\mu$m thickness is obtained herein (see FIG. 7 and FIG. 8 as for the above).

Figure 9:
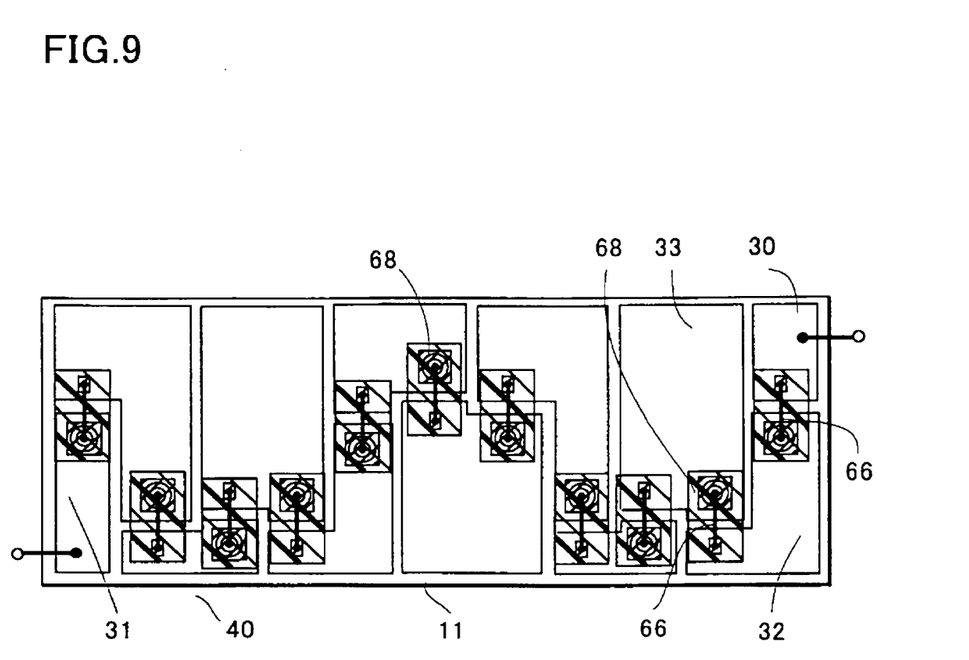
FIG. 9 is a view showing a lighting apparatus using the light irradiating device of the first embodiment.

FIG. 9 shows a lighting apparatus 40 in which the light irradiating devices 68 (light emitting diodes) are connected in series between an electrode 30 and an electrode 31 to make constant the current value that flows through the light irradiating devices 68.

Ten sheets of electrodes are formed between the electrode 30 and the electrode 31. The back surface of the chip serving as the cathode electrode (or the anode electrode) of the light irradiating device 68 is fixed to an electrode 32, and the anode electrode (or the cathode electrode) and the electrode 30 are connected by a metal thin wire 66. Also, the back surface of the chip of the second light irradiating device 68 is fixed to an electrode 33, and the electrode on the surface of the chip and the electrode 32 are connected by the metal thin wire 66. That is, the electrode to which the back surface of the chip serving as the cathode electrode (or the anode electrode) is fixed is connected to the metal thin wire extended from the anode electrode (or the cathode electrode) of the succeeding light irradiating device 68. The series connection can be completed by repeating this connection mode. The light irradiating devices are arranged on the predetermined portion of the electrodes by a robot having movable arm with respect to X-Y-Z (lengthwise direction—crosswise direction—up and down direction), or the like.

Also, in order to form the electrode formed of the copper foil as a reflection plate, Ni is coated on the surface of the electrode. Then, in order to form the all area of the substrate as a substantial reflection plate, the electrodes are patterned such that the overall area of the substrate is covered substantially completely with 12 electrodes from the right electrode 30 to the left electrode 31.

According to the lighting apparatus 40, there can be achieved the advantage such that, since the heat generated from the light irradiating device 68 can be radiated via a metal substrate 11, the driving current of the light irradiating devices 68 can be set large.

Although the illustration is omitted, even if the light irradiating devices 68 are connected in parallel, or the light irradiating devices 68 are connected so that serial connections and parallel connections are combined, similarly the lighting apparatus 40 that have the good radiation characteristic can be accomplished.

The lighting apparatus 40 may be used to traffic light etc., for example.

(Embodiment 2)

Second embodiment of the invention will be explained with reference to the accompanying drawings hereinafter.

First, the difference between the first embodiment and the second embodiment will be described. In the first embodiment, as shown in FIG. 3, at the time of forming the isolation trench 64 by half-etching the conductive foil 61 using the conductive film 62 as a mask, the etching process is applied so that the diameter of an opening portion of the isolation trench 64 is larger than that of the conductive film. Then, the conductive film 62 remains on the isolation trench 64 like a visor. Therefore, the adhesiveness between the conductive foil 61 and insulating resin 67 is improved by the visor.

Figure 11:
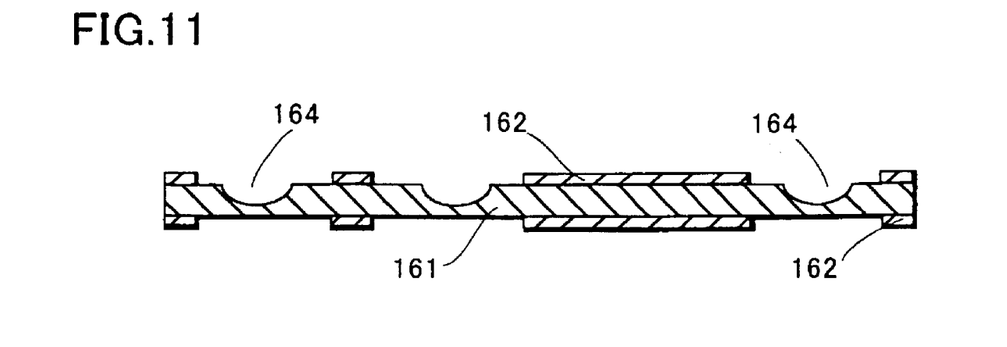
FIG. 11 is a sectional view showing a light irradiating device manufacturing method of the second embodiment.

On the contrary, in the second embodiment, as shown in FIG. 11, a conductive film 162 is formed on a conductive foil 161 as small area as possible (smaller than that of the first embodiment), then, a larger area of the conductive foil is exposed. Therefore, the adhesiveness between the conductive foil 161 and the insulating resin 167 is improved. That is, for example, when the conductive foil 161 is formed of Cu and the conductive film 162 is formed of Ag, the adhesiveness of Au to the insulating resin 167 is inferior to that of Cu. In this case, if the forming area of the conductive film 162 is as small as possible as described above, thus increasing the exposing area of the conductive foil 161 that has better adhesiveness to the insulating resin 167. Therefore, the adhesiveness of the conductive film 162 to the insulating resin 167 is improved.

The second embodiment will be described, the structure other than reducing the forming area of the conductive film 162 is substantially same as the structure of the first embodiment. In order to avoid repeating the same explanation, the description is simplified, regarding same structure, with reference to the numerals wherein 100 is added to the numerals in the first embodiment.

Figure 10:
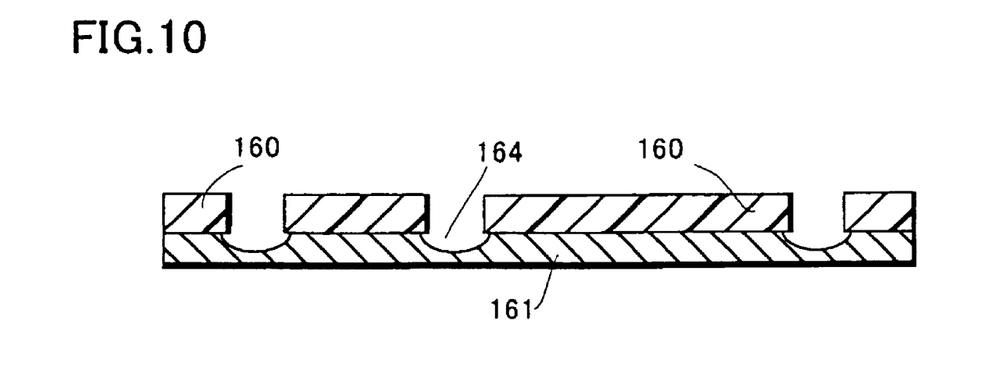
FIG. 10 is a sectional view showing a light irradiating device manufacturing method of the second embodiment.

In FIG. 10, 161 represents a sheet-like conductive foil. The material is selected with regard to the adhesive property, the bonding property, and the plating property of the brazing material. The conductive foil containing Cu as main material, the conductive foil containing Al as main material, the conductive foil formed of the alloy such as Fe—Ni, Cu—Al, Al—Cu—Al etc., or the like may be employed.

It is preferable that a thickness of the conductive foil should be set to about 10 μm to 300 μm in light of the later etching. Here the copper foil of 100 μm thickness is employed. But basically the thickness of more than 300 μm or less than 10 μm may be employed. As described later, any thickness may be selected if isolation trenches 164 that is shallower than the thickness of the conductive foil 161 can be formed in the conductive foil.

In this case, the sheet-like conductive foil 161 that is wound on a roller to have a predetermined width may be prepared and then be carried to respective steps described later, otherwise the conductive foil that is cut into a predetermined size may be prepared and then be carried to respective steps described later.

Then, if the half-etching process is applied to the conductive foil 161 while using the photoregist film 160 as a mask in a state that the back surface of the conductive foil 161 is masked by a photoregist film (not shown), predetermined areas are half-etched and then isolation trenches 164 are formed. In this case, a depth of the isolation trench 164 formed by this etching is 50 μm, for example, and the adhesiveness to a resin 167, described later, can be improved since side surfaces of the trench become a rough surface.

The half-etching process may be applied by using the photoresist film as a mask formed to entirely cover an Ag film 162 described later, after forming the Ag film 162 on the conductive foil 161.

Also, the side wall sectional shape of this isolation trench 164 has a different structure according to the removing method. As this removing method, the wet etching, the dry etching, the laser evaporation, the dicing, etc. maybe employed.

For example, in the case of the wet etching, the iron (II) chloride or the copper (II) chloride is employed mainly as the etchant. The conductive foil 161 is dipped into this etchant or is showered with this etchant. Since normally the conductive foil is anti-anisotropically etched by the wet etching, the side surface of the etched portion has a curved structure.

Also, in the case of the dry etching, the anisotropic etching or the anti-anisotropic etching may be carried out. It is said at present that Cu cannot be removed by the reactive ion etching, but Cu can be removed by the sputtering. Also, the anisotropic etching or the anti-anisotropic etching can be carried out depending upon the conditions of the sputtering.

In addition, in the case of the laser evaporation, the isolation trench 164 can be formed by irradiating directly the laser beam. In this case, the side surface of the isolation trench 164 is rather formed as a flat surface.

Further, in the case of the dicing, it is impossible to form a complicated curved pattern, but it is possible to form the lattice isolation trench.

Then, in FIG. 11, the plating process is applied to predetermined areas of the front surface and the back surface of the conductive foil 161 respectively. In the present embodiment, a film formed of Ag (referred to as an "Ag film 162" hereinafter) is formed as the conductive film 162, but the conductive film is not limited to this. For example, there are Au, Ni, Pd, Al, or the like, as other materials. In addition, these corrosion-resistant conductive films have the feature that they can be practically employed as the die pad or the bonding pad as they are. Further, the Ag film 162 formed only on the front surface of the conductive foil 161 maybe employed.

For example, the above Ag film 162 adheres to not only Au but also the brazing material. Therefore, if the Au film is coated on the back surface of the chip, the chip can be bonded to the Ag film 162 on a conductive path 151 by the thermo compression bonding as it is, and also the chip can be fixed via the brazing material such as the solder, etc. Further, since the Au thin wire can be fixed to the Ag conductive film, it is also possible to apply the wire bonding.

Then, a forming area of the Ag film 162 formed on the conductive foil 161, as a feature of the second embodiment, is smaller as compared with the forming area of Ag film 62 according to the first embodiment. That is, in the second embodiment, it may be enough for the forming area of the Ag film 162 to have at least a reflecting surface of the inclined portion formed by a convex portion 163 described later for reflecting the light irradiated from the photo semiconductor chip 165, e.g., only the surface of a cup-shaped photo semiconductor chip mounting portion formed by the convex portion 163 which is formed by applying the press process to the conductive foil 161, and a metal thin line connecting portion (second electrode 151B described later) where the photo semiconductor chip 165 is wire-bonded.

By the above structure, since the area where the conductive foil 161 contacts the insulating resin 167 increases as compared with the first embodiment, the adhesiveness between the conductive foil 161 and insulating resin 167 is improved. (see FIG. 12 to FIG. 14)

Figure 12:
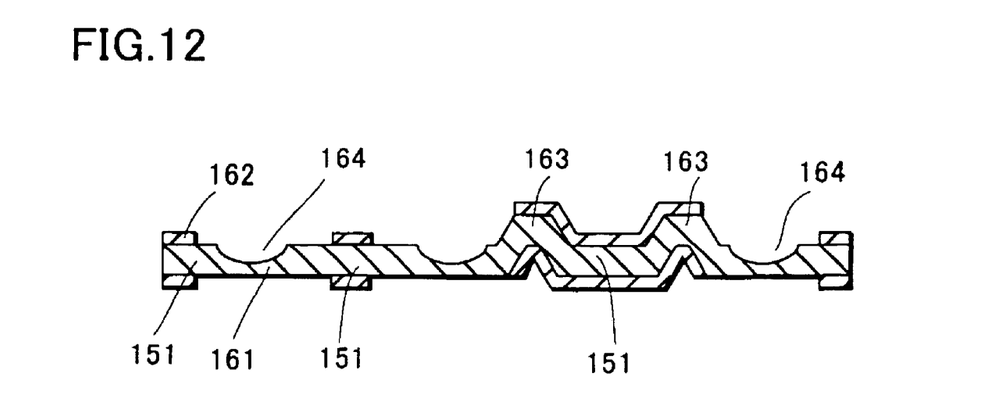
FIG. 12 is a sectional view showing a light irradiating device manufacturing method of the second embodiment.

Then, in FIG. 12, predetermined area of the conductive foil 161 are formed as an upwardly convex portion by applying the pressing process to the conductive foil 161, which is subjected to the plating process, thereby a convex portion 163 is formed. In this case, a photo semiconductor chip 165 described later is mounted in the photo semiconductor chip mounting portion of the sectional cup-shaped area formed by the convex portion 163. Then, the light emitted from the photo semiconductor chip 165 can be reflected by a inclined portion formed by the convex portion 163 and the periphery of the inclined portion, and thus the irradiation efficiency can be improved. Further, if the pressing process is applied to the conductive foil 161 after the Ag film 162 is coated on the conductive foil 161, the gloss appears in the area pressed and bent (head portion of the convex portion 163) other than remaining areas. Thus, there can be achieved the advantage such that the reflection efficiency of the light emitted from the photo semiconductor chip, described later, can be improved.

It is of course that the conductive film may be formed after the press working. Further, the photo semiconductor chip may be formed on the conductive foil that is not subjected to the press working.

In this case, as described above, the gloss can be given to the Ag film 162 by not bending the conductive foil 61 but applying the pressure to the conductive foil 161 (and the Ag film 162) by the press, etc. in the situation that the Ag film 162 is formed, and thus the improvement of the irradiation efficiency can be achieved.

Figure 13:
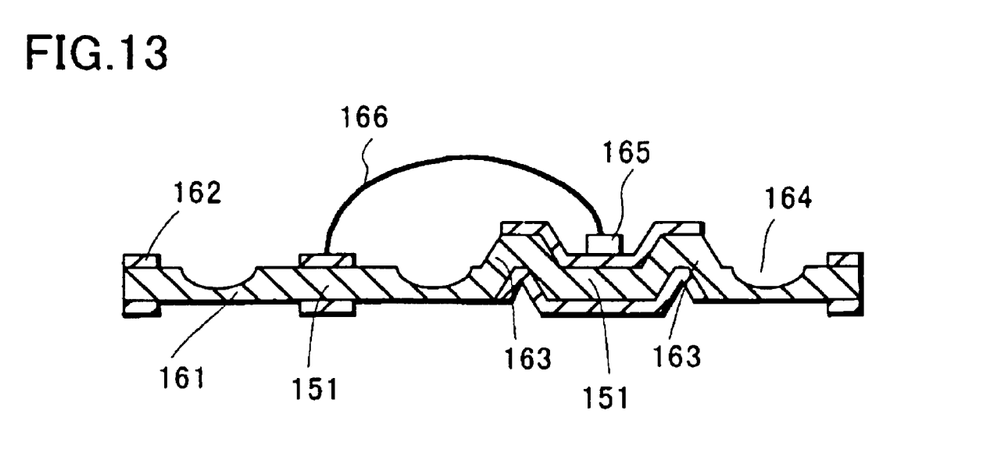
FIG. 13 is a sectional view showing a light irradiating device manufacturing method of the second embodiment.

Then, in FIG. 13, the photo semiconductor chip 165 is electrically connected to the conductive foil 161 in which the isolation trenches 164 are formed. Here the light emitting diode is employed as the photo semiconductor chip 165. The photo semiconductor chip 165 is bonded onto a first electrode 151A, described later, by the die bonding, and also the front surface of the photo semiconductor chip 165 and a second electrode 151B are bonded by the wire bonding via a metal thin wire 166 (see FIG. 15).

Figure 14:
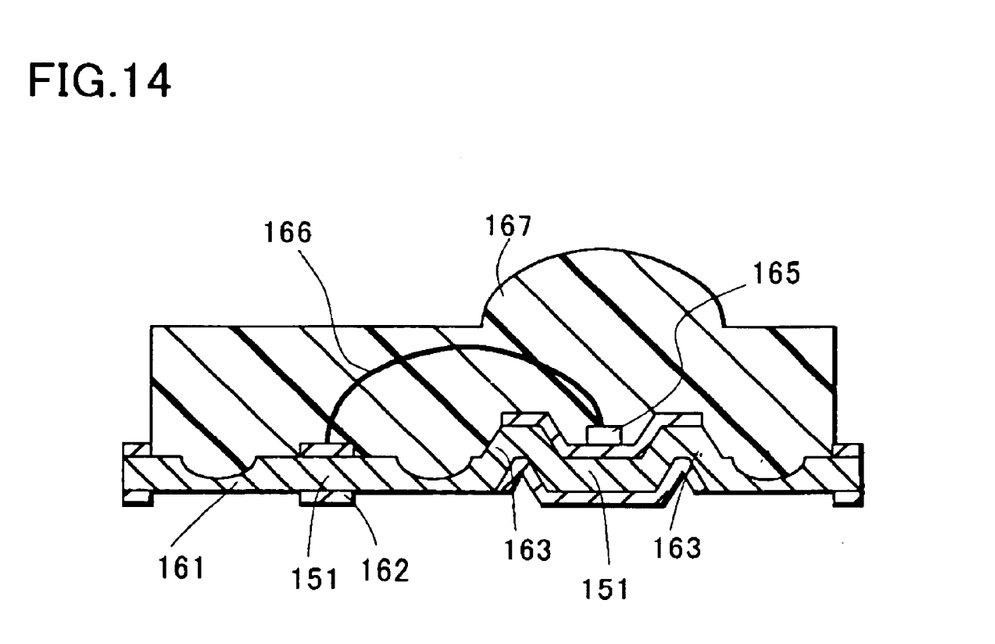
FIG. 14 is a sectional view showing a light irradiating device manufacturing method of the second embodiment.

Then, in FIG. 14, the conductive foil 161 containing the photo semiconductor chips 165 is covered with the insulating resin 167 that can transmit the light emitted from the photo semiconductor chip 165. In this step, the conductive foil 161 having the photo semiconductor chips 165 and the isolation trenches 164 is sealed with the thermosetting silicon resin or epoxy resin by virtue of the transfer molding using the mold (not shown). As described above, the resin 67 may be any resin which can transmit the light, and thus the so-called transparent resin or the opaque resin can transmit the light of a predetermined wavelength may be employed.

Figure 17:
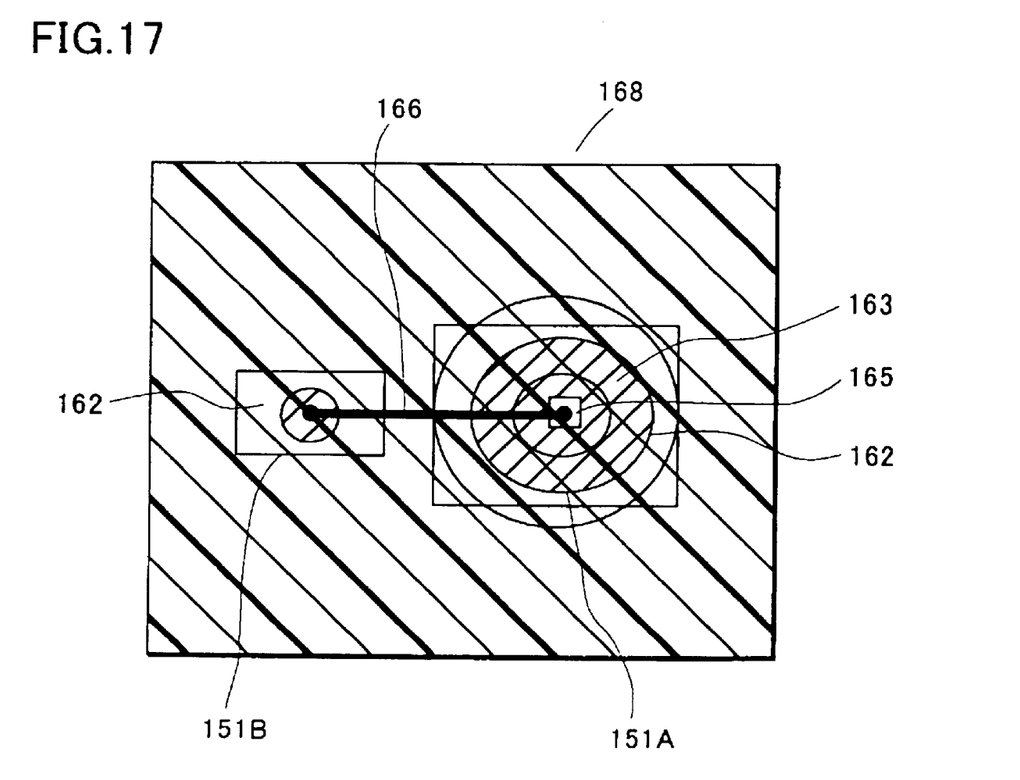
FIG. 17 is a plan view of a light irradiating device of the second embodiment.

Here, in order to collect the light from the photo semiconductor chips 165 as much as possible and emit it upward, the resin 167 has a convex lens shape. Accordingly, if viewed from the top, the lens has a substantially circular shape, as shown in FIG. 17. A thickness of the resin 167 (lens) coated on the surface of the conductive foil 161 can be set thick or thin with regard to the strength.

The feature of the present step is that the conductive foil 161 acts as the supporting substrate until the light resin 167 serving as the lens is coated. Then, since the good radiation characteristic is obtained rather than the structure in which the light emitting diodes 2 are mounted onto the printed circuit board like the related art (see FIG. 19), the driving capability can be improved.

Further, since the conductive foil 161, used as the supporting substrate in the present invention, is the material that is necessary for the electrode material. Therefore, the present invention has the advantage such that the constituent material can be omitted to the utmost and can also achieve the reduction in cost.

Also, since the isolation trench 164 is formed shallower than the thickness of the conductive foil 161, the conductive foil 161 is not individually separated as the conductive paths 151. Accordingly, there is the advantage such that, when the sheet-like conductive foil 161 must be exchanged as a whole and then the resin 167 must be molded, the carrying operation to the mold and the fitting operation into the mold can be very simplified.

When the photo semiconductor chip 165 is sealed with the resin, the potting resin may be coated on the photo semiconductor chip 165 instead of the employment of the mold so as to form the lens shape.

However, in this case, since both the silicon resin and the epoxy resin has small viscosity at the time of the heat curing, there is the problem such that the resin cannot be stably formed into the hemispherical shape that is preferable as the lens. In contrast, there is the advantage such that, if the above lens forming method using the mold is employed, the stable lens shape can be constructed. When the lens shape is not needed, the insulating resin 167 may be somewhat thin, further, others than transfer molding using the mold may be used.

Figure 15:
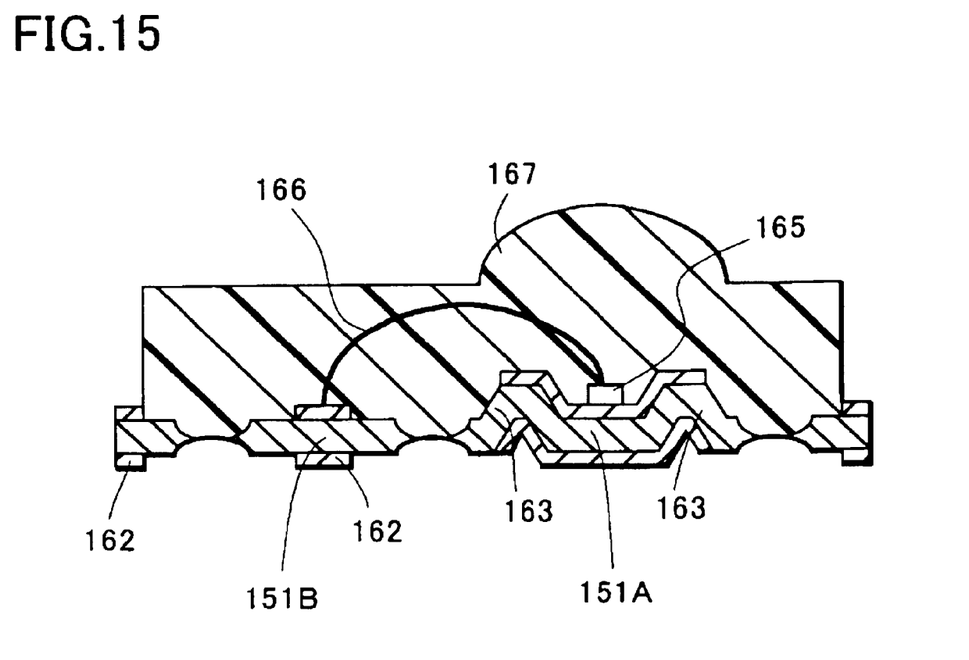
FIG. 15 is a sectional view showing a light irradiating device manufacturing method of the second embodiment.

In turn, in FIG. 15, there is the step that the conductive foil 161 is separated as the conductive paths 151 by removing the back surface of the conductive foil 161 chemically and/or physically. Here this removing step is carried out by the polishing, the grinding, the etching, the metal evaporation by the laser, etc.

In the present embodiment, the conductive foil 161 under the isolation trench 164 is deleted by wet-etching the conductive foil 161 while using the Ag film 162, that adheres onto the back surface of the conductive foil 161, as a mask. Thus, the resin 167 is exposed to separate the conductive paths respectively. Accordingly, there can be obtained such a structure that surfaces of conductive paths 151A, 151B (a first electrode and a second electrode) are exposed from the resin 167.

At this time, the resin 167 may be exposed from the isolation trench 164 by scraping the back surface of the conductive foil 161 by about 50–60 $\mu$m by virtue of the polishing machine, the grinding machine, or the like. In this case, the conductive foil 161 is separated as the conductive paths having a thickness of about 40 $\mu$m. Also, the resin 167 may be exposed by wet-etching the entire surface of the conductive foil 161 to the extent not to expose the resin 167, and then scraping the overall surface by virtue of the polishing or grinding machine. In this case, the flat light irradiating device, in which the conductive paths 151 are buried in the resin 167 and the back surface of the resin 167 coincides in level with the back surface of the conductive paths 151, can be implemented.

Further, if the conductive paths 151 are separated by scraping the back surface of the conductive foil 161 by virtue of the polishing machine, the grinding machine, or the like, the oxidation inhibiting process of the conductive paths 151 may be applied by depositing the conductive material such as the solder, etc. onto the exposed conductive paths 151, as occasion demands.

Finally, there is the step of separating the neighboring light irradiating devices individually to complete the light irradiating device.

Figure 16:
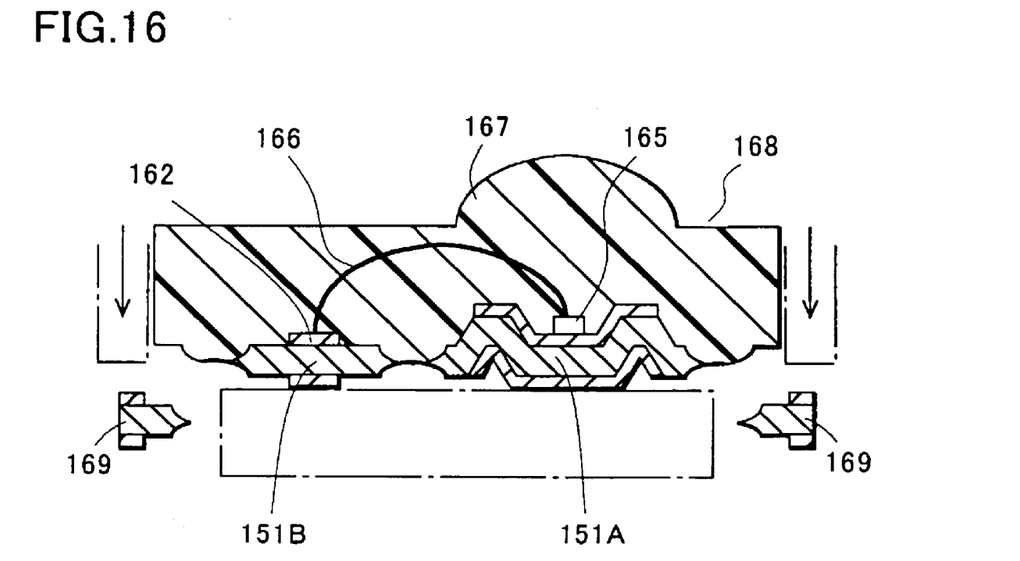
FIG. 16 is a sectional view showing a light irradiating device manufacturing method of the second embodiment.

This separating step can be carried out by the dicing, the cutting, the chocolate break, etc. If the chocolate break is employed, copper pieces 169 are stripped off from both end portions of the resin 167, that covers the light irradiating devices 168, by the press machine indicated by a dot-dash line in FIG. 16, whereby respective light irradiating devices 168 are separated. In this case, there can be achieved the advantage that, since the flash removing process of the back surface can be omitted unlike the dicing, the cutting, etc., the good workability can be achieved.

The feature of the present manufacturing method resides in that the separating operation of the conductive paths 151 can be attained while practically using the resin 167 as the supporting substrate. The resin 167 is the material necessary to fill the conductive paths 151, and the substrate used only for the supporting is not needed during the manufacturing steps. Accordingly, the present invention has the feature such that the light irradiating device can be manufactured by the minimum material and thus the reduction in cost can be accomplished.

The thickness of the resin from the surface of the conductive paths 151 can be adjusted when the resin is adhered in the preceding step. Therefore, the present invention has the feature such that the thickness of the light irradiating device 168 can be set thick or thin although such thickness is different according to the packaged photo semiconductor chip. The light irradiating device in which the conductive paths 151 of 40 µm thickness and the photo semiconductor chips are buried in the resin 167 of 400 µm thickness is obtained herein (see FIG. 16 and FIG. 17 as for the above).

Figure 18:
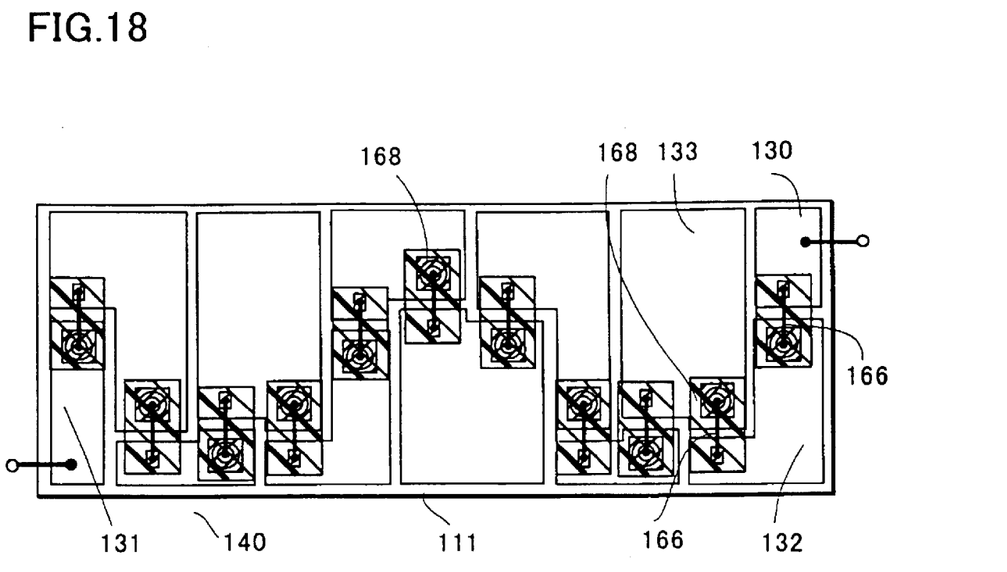
FIG. 18 is a view showing a lighting apparatus using the light irradiating device of the second embodiment.

FIG. 18 shows a lighting apparatus 168 in which the light irradiating devices 168 (light emitting diodes) are connected in series between an electrode 130 and an electrode 131 to make constant the current value that flows through the light irradiating devices 168.

Ten sheets of electrodes are formed between the electrode 130 and the electrode 131. The back surface of the chip serving as the cathode electrode (or the anode electrode) of the light irradiating device 168 is fixed to an electrode 132, and the anode electrode (or the cathode electrode) and the electrode 130 are connected by a metal thin wire 166. Also, the back surface of the chip of the second light irradiating device 168 is fixed to an electrode 133, and the electrode on the surface of the chip and the electrode 132 are connected by the metal thin wire 166. That is, the electrode to which the back surface of the chip serving as the cathode electrode (or the anode electrode) is fixed is connected to the metal thin wire extended from the anode electrode (or the cathode electrode) of the succeeding light irradiating device 168. The series connection can be completed by repeating this connection mode. The light irradiating devices are arranged on the predetermined portion of the electrodes by a robot having movable arm with respect to X-Y-Z (lengthwise direction—crosswise direction—up and down direction) The lighting apparatus 140 may be used to traffic light etc., for example.

Also, in order to form the electrode formed of the copper foil as a reflection plate, Ni is coated on the surface of the electrode. Then, in order to form the all area of the substrate as a substantial reflection plate, the electrodes are patterned such that the overall area of the substrate is covered substantially completely with 12 electrodes from the right electrode 130 to the left electrode 131.

According to the lighting apparatus 140, there can be achieved the advantage such that, since the heat generated from the light irradiating device 168 can be radiated via a metal substrate 111, the driving current of the light irradiating devices 168 can be set large.

Although the illustration is omitted, even if the light irradiating devices 168 are connected in parallel, or the light irradiating devices 168 are connected so that serial connections and parallel connections are combined, similarly the lighting apparatus 140 that have the good radiation characteristic can be accomplished.

Further, as a means for improving the adhesiveness between the conductive foil 61, 161 and the insulating resin 67, 167, the surface of the conductive foil 61, 161 may be oxidized to form a copper oxide film (CuO, or $Cu_2O$). This improves the adhesiveness without forming conductive film 62, 162.

In addition, according to the inventors, it is found that the better adhesiveness is obtained when the state of the surface of the conductive film 61, 161 is $Cu_2O$ state rather than CuO state, that is, lower oxidization rate the better adhesiveness can be obtained.

As apparent from the above explanation, in the present invention, it is possible to accomplish the light irradiating device that can be constructed by the required minimum elements including the photo semiconductor chip, the conductive paths (conductive electrodes), and the resin serving as the lens and that can save waste of the resource. Accordingly, it is possible to accomplish the light irradiating device in which no extra element is needed until the completion and the cost can be reduced considerably. Also, the very small, thin, and lightweight light irradiating device can be accomplished by setting the coated thickness of the resin and the thickness of the conductive foil to their optimum values.

Further, since only the back surfaces of the conductive paths are exposed from the resin, the present invention has the advantage such that the back surfaces of the conductive paths can be immediately connected to the outside and thus the back surface electrodes and the through holes in the conventional structure can be omitted. Also, the radiation characteristic can be improved rather than the structure in which the photo semiconductor chips are mounted on the printed circuit board in the related art, and thus the driving capability of the photo semiconductor chips can be increased.

Also, if the conductive film is formed at least in the areas of the surface of the conductive foil as the conductive paths, this conductive film is left on the upper surface of the conductive foil like the visor when the isolation trenches are formed in the conductive foil. Therefore, the adhesiveness between the conductive foil and the resin can be improved when the light irradiating device is covered with the resin.

Further, if the conductive foil is bent to have an inclination angle that enables the light emitted from the photo semiconductor chip to reflect upwardly when such conductive foil is bent to surround at least the areas of the conductive foil to which the photo semiconductor chips are fixed, the irradiation efficiency can be improved.

If the conductive foil is bent by a press in the situation that the conductive film is formed on the conductive paths, the gloss appears on the conductive film and thus the irradiation efficiency can be improved further.

Also, after the light irradiating devices are covered with the resin to fill the isolation trenches, there are provided the step of removing the conductive foil on the side, in which the isolation trenches are not provided, up to a predetermined position and then the step of separating the light irradiating devices that are covered with the resin. Therefore, respective light irradiating devices are not separated up to the final stage, and accordingly the conductive foil can be provided to respective steps as one sheet and thus the workability becomes good.

Further, since the resin is adhered by the transfer molding employing the mold, the workability becomes good and the proper shape can be formed. Particularly, it is suitable for forming a lens shape.

Also, in case the light irradiating devices that are sealed with the resin are separated individually by the press machine, the process of removing the flash generated on the end portions of the light irradiating devices is not needed and thus the productivity can be improved.

What is claimed is:

1. A light irradiating device comprising:

a plurality of conductive paths that are electrically isolated;

a photo semiconductor chip fixed on one of the conductive paths; and a resin which transmits light for covering the photo semiconductor chip to support the conductive paths integrally.

2. The light irradiating device according to claim 1, wherein the conductive paths are electrically isolated by an isolation trench, wherein the resin filled in the isolation trench.

3. The light irradiating device according to claim 2, wherein the front surfaces of the conductive paths are covered by the resin, wherein the back surfaces of the conductive paths are exposed.

4. The light irradiating device according to claim 1, further comprising:
a connecting member which connects an electrode of the photo semiconductor chip with at least one of the conductive paths.

5. The light irradiating device according to claim 4, wherein the connecting member is formed by a bonding wire.

6. The light irradiating device according to claim 1, further comprising:
a conductive film formed of the metal material different from the material of the conductive paths and provided on the upper surfaces of the conductive paths.

7. The light irradiating device according to claim 6, wherein the conductive film is formed up to at least the inside of an opening portion of the isolation trench.

8. The light irradiation device according to claim 6, wherein the conductive film is formed outside of an opening portion of the isolation trench.

9. The light irradiating device according to claim 6, wherein the conductive paths are formed of a conductive foil made of one of copper, aluminum, iron-nickel, copper-aluminum, and aluminum-copper-aluminum.

10. The light irradiating device according to claim 6, wherein the conductive film is formed by one of plating nickel, gold, palladium, and silver.

11. The light irradiating device according to claim 1, wherein the conductive paths are employed as at least one of areas of electrodes, bonding pads, and die pads.

12. The light irradiating device according to claim 1, wherein the conductive path on which the semiconductor chip is provided includes a bending portion having a inclined portion provided around the photo semiconductor chip so that the light from the photo semiconductor chip is upwardly reflected.

13. A lighting apparatus comprising a plurality of the light irradiating device according to claim 1 on a metal substrate.

* * * * *